United States Patent [19]

Loerzer et al.

[11] Patent Number: 5,468,596
[45] Date of Patent: Nov. 21, 1995

[54] PHOTOSENSITIVE RECORDING ELEMENT AND PRODUCTION OF A RELIEF PRINTING PLATE

[75] Inventors: Thomas Loerzer, Neustadt; Thomas Telser, Weinheim; Thomas Zwez, Karlsruhe; Bernhard Albert, Maxdorf, all of Germany

[73] Assignee: BASF Lacke + Farben AG, Muenster, Germany

[21] Appl. No.: 372,829

[22] Filed: Jan. 13, 1995

Related U.S. Application Data

[63] Continuation of Ser. No. 179,939, Jan. 11, 1994, abandoned.

[30] Foreign Application Priority Data

Jan. 15, 1993 [DE] Germany ............ 43 00 856.9

[51] Int. Cl.$^6$ ............................................. G03F 7/038
[52] U.S. Cl. .................... 430/306; 430/256; 430/259; 430/260; 430/263; 430/309; 430/328
[58] Field of Search ................................. 430/256, 259, 430/260, 263, 306, 309, 328

[56] References Cited

U.S. PATENT DOCUMENTS

| | | | |
|---|---|---|---|
| 3,549,367 | 12/1970 | Chang et al. | 430/278 |
| 3,990,897 | 11/1976 | Zuerger et al. | 430/273 |
| 4,189,322 | 2/1980 | Hoffmann et al. | 430/284 |
| 4,198,241 | 4/1980 | Bronstert et al. | 430/284 |
| 4,202,696 | 5/1980 | Takahashi et al. | 430/306 |
| 5,002,850 | 3/1991 | Shinozaki et al. | 430/259 |
| 5,286,597 | 2/1994 | Suzuki et al. | 430/259 |

FOREIGN PATENT DOCUMENTS

| | | |
|---|---|---|
| 1252330 | 4/1989 | Canada . |
| 017927 | 9/1984 | European Pat. Off. . |

*Primary Examiner*—Hoa Van Le
*Attorney, Agent, or Firm*—Keil & Weinkauf

[57] ABSTRACT

A photosensitive recording element comprises (A) a dimensionally stable substrate, (B) a photopolymerizable relief-forming recording layer and, if required, an adhesion-promoting layer arranged between (A) and (B), a release layer (C) applied to that side of the recording layer (B) which faces away from the substrate (A), and, if required, a cover sheet (D) applied thereon, the photopolymerizable relief-forming recording layer (B) containing $b_1$) at least one polymeric binder, $b_2$) at least one photopolymerizable olefinically unsaturated monomer which is compatible with $b_1$), $b_3$) at least one photopolymerization initiator and $b_4$) at least one aryl alkyl ketone, and is suitable for the production of relief printing plates.

2 Claims, No Drawings

PHOTOSENSITIVE RECORDING ELEMENT AND PRODUCTION OF A RELIEF PRINTING PLATE

This application is a continuation of application Ser. No. 08/179,939, filed on Jan. 11, 1994 now abandoned.

The present invention relates to a photosensitive recording element comprising (A) a dimensionally stable substrate,
(B) a photopolymerizable relief-forming recording layer and, if required, an adhesion-promoting layer arranged between (A) and (B), a release layer (C) applied to that side of the recording layer (B) which faces away from the substrate (A), and, if required, a cover sheet (D) applied thereon, the photopolymerizable relief-forming recording layer (B) containing $b_1$) at least one polymeric binder, $b_2$) at least one photopolymerizable olefinically unsaturated monomer which is compatible with $b_1$), $b_3$) at least one photopolymerization initiator and $b_4$) at least one further photosensitive organic compound.

The present invention furthermore relates to a novel process for the production of relief printing plates having a nontacky printing surface, comprising a photosensitive recording element which contains a dimensionally stable substrate and a photopolymerizable relief-forming recording layer which, in addition to at least one polymeric binder, at least one photopolymerizable olefinically unsaturated monomer and at least one photopolymerization initiator, also contains at least one further photosensitive compound. The novel production process comprises the steps of imagewise exposure of the photopolymerizable relief-forming recording layer to actinic light, washing out (development) of the unexposed and therefore nonphotopolymerized parts of the imagewise exposed relief-forming recording layer with developer and postexposure (aftertreatment) of the photopolymerized relief layer obtained in this manner to light having a wavelength $\lambda$ of <300 nm.

Photosensitive recording elements for the production of relief printing plates which contain a dimensionally stable substrate and a photopolymerizable relief-forming recording layer with at least one polymeric binder, at least one photopolymerizable olefinically unsaturated monomer which is compatible with the polymeric binder, at least one photopolymerization initiator and at least one further photosensitive compound are disclosed, for example, in DE-A-27 22 421, DE-A-27 20 560 or DE-A-32 48 247.

Processes for the production of relief printing plates having a nontacky printing surface which comprise the process steps stated at the outset are furthermore disclosed in DE-A-28 21 500, EP-0 017 927 and DE-A- 39 08 059.

In the production process described in DE-A- 28 21 500, the relief layer produced by imagewise exposure and washing out (development) of the unexposed and therefore nonpolymerized parts of the imagewise exposed relief-forming recording layer is impregnated in its surface with a hydrogen-abstracting compound, such as 9,10-anthraquinone, prior to the postexposure (aftertreatment) to light having a wavelength $\lambda$ of <300 nm.

In the production process which is described in EP-B-0 017 927, a photosensitive recording material which contains, as an essential component, a solvent-soluble polymer having polymer segments comprising a conjugated diene monomer in the main chain and at least one photopolymerizable olefinically unsaturated monomer and a photopolymerization initiator is used. As is evident from column 7, lines 45 to 60, of this patent, benzophenone, Michler's ketone or a number of further compounds can be used as photopolymerization initiators. In addition, it is stated therein that the photopolymerization initiators mentioned here can be used either alone or in combination. However, no indication is given as to which photopolymerization initiators are to be combined with one another here.

DE-A-39 08 059 describes a production process in which the photosensitive recording layer is composed of at least one block-copolymeric binder, at least one photopolymerizable olefinically unsaturated monomer, at least one photopolymerization initiator and, as a further photosensitive compound, benzophenone and/or mono- or polysubstituted benzophenones, and a relief layer which acquires a nontacky surface as a result of postexposure (after treatment) to light having a wavelength $\lambda$ of < 300 nm is produced by imagewise exposure and washing out (development) of the unexposed parts.

However, these three known processes have disadvantages. Either they require an additional treatment step, for example the impregnation of the surface of the photopolymerized relief layer with 9,10-anthraquinone, or they are limited to photosensitive recording elements having photopolymerizable relief-forming recording layers possessing a special composition and, in the case of other photosensitive recording layers, do not lead to the desired success of the process, i.e. the production of a nontacky printing surface. Furthermore, the production of a relief layer according to DE-A-39 08 059 has a major disadvantage since benzophenone and the stated derivatives have a high absorbance in the actinic range, similar to that of the photopolymerization initiators used, and thus greatly increase the exposure times. This is noticeable in particular when it is desired to obtain great relief depths of more than 1 mm, in particular more than 3 mm.

It is an object of the present invention to provide a novel recording element and a novel process for the production of a relief printing plate, in particular of a flexographic printing plate, whose photopolymerized relief layer has a nontacky printing surface, the novel surface comprising the steps (1) imagewise exposure of a photosensitive recording element which contains a dimensionally stable substrate and a photopolymerizable relief-forming recording layer to actinic light, (2) washing out (development) of the unexposed and therefore nonphotopolymerized parts of the imagewise exposed relief-forming recording layer with a developer and (3) postexposure (aftertreatment) of the photopolymerized relief layer obtained in this manner to light having a wavelength $\lambda$ of < 300 nm and not having the disadvantages of the prior art.

We have found that this object is achieved, surprisingly, if at least one further photosensitive compound selected from the class consisting of the aryl alkyl ketones is added to the photopolymerizable relief-forming recording layer of the photosensitive recording element which is used for the novel process. In view of the unexpected experimental finding that aryl alkyl ketones alone do not act as photopolymerization initiators in the photopolymerizable relief-forming recording layers during exposure to actinic light, the achievement of the object according to the invention was all the more surprising.

The present invention relates to a photosensitive recording element comprising (A) a dimensionally stable substrate,
(B) a photopolymerizable relief-forming recording layer and, if required, an adhesion-promoting layer arranged between (A) and (B), a release layer (C) applied to that side of the recording layer (B) which faces away from the substrate (A), and, if required, a cover sheet (D) applied thereon, the photopolymerizable relief-forming recording layer (B) containing $b_1$) at least one polymeric binder, $b_2$) at least one photopolymerizable olefinically unsaturated monomer which is compatible with $b_1$), $b_3$) at least one photopolymerization initiator and $b_4$) at least one further photosensitive organic compound, wherein one or more aryl alkyl ketones are used as the photosensitive organic compound $b_4$).

Preferred aryl alkyl ketones $b_4$) are those which contain 1 to 18 carbon atoms in the alkyl radical.

The present invention furthermore relates to a process for the production of a relief printing plate having a nontacky printing surface, wherein the novel photosensitive recording element (1) is exposed imagewise, (2) the unexposed parts of the relief-forming recording layer (B) are removed using a developer and (3) the photopolymerized relief layer thus obtained is aftertreated with light having a wavelength $\lambda$ of <300 nm.

The present invention also relates to the use of aryl alkyl ketones and/or mixtures thereof in the aftertreatment of the surface of photopolymeric relief layers with light having a wavelength $\lambda$ of <300 nm.

The relief printing plates produced by the novel process have nontacky printing surfaces.

Regarding the novel photosensitive recording element for the production of relief printing plates having a nontacky printing surface, the following may be stated specifically.

Suitably dimensionally stable substrates are those conventionally used for the production of printing plates.

Examples of suitable dimensionally stable substrates are sheets, films and conical and cylindrical sleeves of metals, such as steel, aluminum, copper or nickel, or of plastics, such as polyethylene terephthalate, polybutylene terephthalate, polyamide and polycarbonate, woven fabrics and nonwovens, such as glass fiber fabrics, and composite materials comprising glass fibers and plastics.

The photopolymerizable relief-forming recording layer (B) which contains $b_1$) at least one polymeric binder, $b_2$) at least one photopolymerizable, olefinically unsaturated monomer compatible with $b_1$), $b_3$) at least one photoinitiator and $b_4$) at least one further photosensitive organic compound is applied to the dimensionally stable substrate (A), if necessary via a thin adhesion-promoting layer.

Suitable polymeric binders $b_1$) are in principle all those which are conventionally used in photopolymerizable relief-forming recording layers.

Particularly suitable polymeric binders $b_1$) are elastomers.

Examples of particularly suitable elastomic polymer binders $b_1$) are the known polyalkadienes, vinylaromatic/alkadiene copolymers and block copolymers, alkadiene/acrylonitrile copolymers, ethylene/propylene copolymers, ethylene/propylene/alkadiene copolymers, ethylene/acrylic acid copolymers, alkadiene/acrylic acid copolymers, alkadiene/acrylate/acrylic acid copolymers and ethylene/(meth)acrylic acid/(meth)acrylate copolymers.

Elastomers which contain conjugated alkadienes, such as butadiene or isoprene, as polymerized units are very particularly suitable.

The polymeric binder $b_1$) is present in the photopolymerizable recording layer (B) in an amount of from 50 to 95, preferably from 50 to 90, % by weight, based on the total amount of the components present in (B).

Furthermore, the photopolymerizable relief-forming recording layer (B) to be used according to the invention contains conventional and known photopolymerizable olefinically unsaturated monomers $b_2$) which are compatible with the polymeric binders $b_1$), in an amount of from 1 to 60, advantageously from 2 to 50, in particular from 3 to 40, % by weight, based on the total amount of (B). The term compatible indicates that the relevant monomers $b_2$) are so readily miscible with the polymeric binder $b_1$) that no opacity or haze is caused in the relevant photopolymerizable relief-forming recording layer (B). Examples of suitable monomers $b_2$) are the conventional and known acrylates and the methacrylates of monohydric and polyhydric alcohols, acrylamides and methacrylamides, vinyl ethers and vinyl esters, allyl ethers and allyl esters and fumaric and maleic diesters, in particular the esters of acrylic and/or methacrylic acid with monohydric and, preferably, polyhydric alcohols, for example esters of acrylic or methacrylic acid with ethanediol, propanediol, butanediol, hexanediol or oxalkanediols, e.g. diethylene glycol, or esters of acrylic or methacrylic acid with trihydric and polyhydric alcohols, e.g. glycerol, trimethylolpropane, pentaerythritol or sorbitol. Examples of particularly suitable mono- and polyfunctional acrylates or methacrylates are butyl acrylate, butyl methacrylate, 2-ethylhexyl acrylate, lauryl (meth)acrylate, hexanediol diacrylate, hexanediol dimethacrylate, ethylene glycol di(meth)acrylate, butane- 1,4-diol di(meth)acrylate, neopentylglycol di(meth)acrylate, 3-methylpentanediol di(meth)acrylate, 2-hydroxypropyl (meth)acrylate, 2-hydroxyethyl (meth)acrylate, 1,1,1-trimethylolpropane tri(meth)acrylate, di-, tri- and tetraethylene glycol di(meth)acrylate, tripropylene glycol di(meth)acrylate or pentaerythrityl tetra(meth)acrylate, as well as poly(ethylene oxide) di(meth)acrylate, $\omega$-methylpoly(ethylene oxide)-$\alpha$-yl (meth)acrylate, N,N-diethylaminoethyl acrylate, a reaction product of 1 mol of glycerol, 1 mol of epichlorohydrin and 3 mol of acrylic acid, and glycidyl methacrylate and bisphenol A diglycidyl ether acrylate.

Mixtures of photopolymerizable ethylenically unsaturated organic compounds and, for example, mixtures of monofunctional (meth)acrylates, e.g. hydroxyethyl methacrylate, with polyfunctional (meth)acrylates of the above-mentioned type are also suitable.

In addition to the (meth)acrylates, derivatives of (meth)acrylamides, e.g. N-methylol(meth)acrylamidoethers of polyols (e.g. glycol), are also suitable as component $b_2$), particularly if polyamides or polyvinyl alcohols are used as component $b_1$).

Suitable photopolymerization initiators $b_3$) are those generally used for photosensitive recording materials, for example free radical photoinitiators, such as benzoin or benzoin derivatives, such as benzoin ethers of straight-chain or branched monoalcohols of 1 to 6 carbon atoms, e.g. benzoin methyl ether, benzoin ethyl ether, benzoin isopropyl ether, benzoin n-butyl ether or benzoin isobutyl ether, symmetrically or asymmetrically substituted benzil acetals, such as benzil dimethyl acetal, or benzil 1-methyl 1-ethyl acetal, diarylphosphine oxides, such as 2,4,6-trimethylbenzoyldiphenylphosphine oxide or 2,6-dimethoxybenzoyldiphenylphosphine oxide or acryldiarylphosphine oxides according to German Laid-Open Application DOS 2,909,992, or hydroxypropanones, such as 1-phenyl-2-methyl-2-hydroxy-11-propanone, and 1-hydroxycyclohexyl phenyl ketone. They may be used alone or as a mixture with one another or in conjunction with coinitiators, for example benzoin methyl ether with triphenylphosphine, diacylphosphine oxides with tertiary amines or acyldiarylphosphine oxides with benzil dimethyl acetal.

Component $b_3$) is present in the novel recording layer (B) in amounts of from 0.01 to 10, preferably from 0.5 to 5, in particular from 1 to 2, % by weight, based on the total amount of components $b_1$) to $b_4$).

The photopolymerizable relief-forming recording layer (B) contains, as component $b_4$), one or more aryl alkyl ketones, in amounts of from 0.05 to 10, preferably from 0.1 to 5, in particular from 0.5 to 1.5 % by weight, based on the total amount of components present in (B).

Examples of suitable aryl alkyl ketones $b_4$) are those of the general formulae (I) and (II)

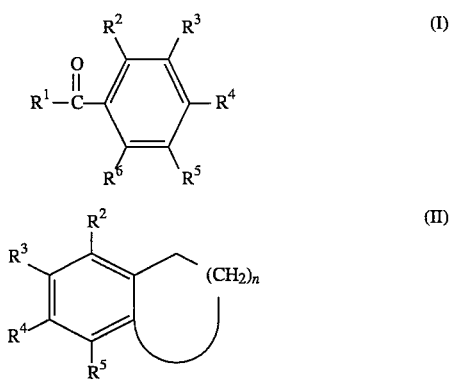

where $R^1$ may be alkyl or alkanediyl, each of 1 to 24 carbon atoms, cycloalkyl or cylcoalkanediyl, each of 3 to 12 carbon atoms, or benzyl, n may be 2, 3, 4, 5 or 6 and $R^2$ to $R^6$ are identical or different and are each H, halogen, e.g. chlorine, hydroxyl, thiolo, cyano, alkyl of 1 to 24 carbon atoms, aryl, e.g. phenyl, alkoxy of 1 to 24 carbon atoms, aryloxy, e.g. phenoxy, alkylthio of 1 to 24 carbon atoms, arylthio, e.g. phenylthio, alkylcarbonyloxy of 1 to 24 carbon atoms, arylcarbonyloxy, e.g. phenylcarbonyloxy, alkylcarbonylthio of 1 to 24 carbon atoms, arylcarbonylthio, e.g. phenylcarbonylthio, alkoxycarbonyloxy of 1 to 24 carbon atoms, aryloxycarbonyloxy, e.g. phenoxycarbonyloxy, alkoxycarbonylthio of 1 to 24 carbon atoms or aryloxycarbonylthio, e.g. phenoxycarbonylthio.

The aryl alkyl ketones $b_4$) are the compounds known per se, whose preparation is carried out in general via Friedel-Crafts acylation of the corresponding aromatics.

Moreover, the photopolymerizable relief-forming recording layer (B) to be used according to the invention may contain further additives, for example thermal polymerization inhibitors, dyes, pigments, photochromic substances, antihalation agents, plasticizers, antioxidants, agents for improving the relief structure, crosslinking agents, fillers and/or reinforcing fillers, in effective amounts.

The production of the photopolymerizable relief-forming recording layer (B) to be used according to the invention from its components is carried out in general by mixing the components with the aid of a known mixing method and by processing the mixture for the recording layer (B) by known methods, such as casting from solution, calendering or extrusion, where these measures may also be combined with one another in a suitable manner.

The thickness of the photopolymerizable relief-forming recording layer (B) to be used according to the invention is advantageously from 200 µm to 1 cm, in particular 300 µm to 6 mm.

The novel photosensitive recording element may also contain further layers. Thus, a flexible and resilient lower layer according to DE-A-24 44 118 may be placed underneath the dimensionally stable substrate (A). Furthermore, a conventional and known release layer (C) and/or a conventional and known cover sheet (D) may be present on that side of the photopolymerizable relief-forming recording layer (B) which faces away from the dimensionally stable substrate (A). If the release layer (C) and/or a conventional and known cover sheet (D) are used together, the release layer (C) is present directly on said recording layer (B), and furthermore an antiadhesion layer may be present between the release layer (C) and the cover sheet (D). Moreover, a firm adhesive bond may be produced between the dimensionally stable substrate (A) and the photopolymerizable relief-forming recording layer (B) with the aid of an adhesion-promoting layer.

In general, the thickness of the adhesion-promoting layers is from 0.5 to 4 µm, that of the release layers (C) is from 0.5 to 20 µm, that of the cover sheets (D) is from 20 to 250 µm and that of the antiadhesion layer is from 0.1 to 0.5 µm.

The production of the novel recording element has no special features in terms of the method but is carried out by applying the photopolymerizable relief-forming recording layer (B) to be used according to the invention to the dimensionally stable substrate (A) by casting from solution, hot pressing, calendering or extrusion. The other layers can then be applied in a known manner to this two-layer element. However, it is also possible first to apply said recording layer (B) to that side of a cover sheet (D) which is covered with a release layer (C) and then firmly to bond the uncovered side of said recording layer (B) to the dimensionally stable substrate (A).

In the novel process, the novel recording element is exposed imagewise to actinic light in process step (1). Examples of suitable sources of actinic light are the conventional and known high pressure, medium pressure or low pressure mercury lamps, UV fluorescent tubes or lamps doped with metal halides.

Thereafter, the unexposed and therefore unpolymerized parts of the imagewise exposed relief-forming recording layer (C) are washed out or developed with a suitable developer. Examples of suitable developers are the conventional and known nonpolar, aprotic polar and protic polar solvents as well as mixtures thereof, as usually used for this purpose. In general, process step (2) is carried out in the conventional and known spray and brush washers.

After process step (2), the resulting photopolymerized relief layer is postexposed to, or aftertreated with, light having a wavelength λ of <300 nm, in particular from 200 to 300 nm.

Examples of suitable sources of light of this wavelength are the conventional and known bactericidal or sterilization lamps.

The novel process may comprise further steps. Examples of suitable further process steps are uniform preexposure of the novel recording medium to actinic light from its front and/or back, removal of any cover sheet (D) which may be present in the novel recording element, separate washing out of any release layer (C) which may be present in the imagewise exposed recording element, drying the photopolymerized relief layer or allowing it to stand before carrying out process step (3) and uniform postexposure of the photopolymerized relief layer to light having a wavlength λ of > 300 nm before and/or after process step (3).

The novel process has many particular advantages.

Thus, the novel process can be used not only for the production of relief printing plates having a nontacky printing surface but also for the production of nontacky decorative relief forms. However, the particular advantages of the novel process are very important for the production of flexographic relief printing plates because the surface tack is very particularly troublesome in this application. Here, the novel process gives flexographic relief printing plates whose elastomeric photopolymerized relief layer has a nontacky printing surface. Owing to the composition of the novel recording material or of its photopolymerizable relief-forming recording layer (B), the times for the imagewise exposure of said recording layer (B) and the postexposure to light having a wavelength λ of <300 nm in the novel process are shorter than in the prior art process, which constitutes significant progress for industrial practice. Furthermore, the relief layers obtained exhibit substantially better support for fine relief parts, such as i dots and lines, which is extremely important particularly in the case of large relief depths of more than 1 mm, in particular 3 mm or more. In addition, the flexographic relief printing plates produced by the novel procedure, and their photopolymerized relief layers, do not tend to exhibit embrittlement or cracking during the postexposure or during prolonged storage and/or continuous use. Said relief printing plates can therefore be used considerably more often and for longer in flexographic printing than flexographic relief printing plates produced by the prior art processes and accordingly also give a very much longer run of excellent printed copies. Furthermore, the flexographic relief printing plates produced by the novel procedure have excellent ink acceptance but are extremely stable to the printing ink solvents and are not swelled by these to a troublesome extent.

Photopolymerizable relief-forming recording layers (B) having the composition shown in the Table were used for Examples 1 to 20 described below and Comparative Examples V1 to V4. In all cases here, a conventional and known thermoplastic elastomeric styrene/isoprene/styrene three-block polymer (e.g. Cariflex® TR 1107 from SHELL) was used as the polymeric binder $b_1$), 5% by weight of hexane-1,6-diol diacrylate was used as the photopolymerizable olefinically unsaturated monomer $b_2$), 1.2% by weight of benzil dimethyl ketal was used as the photopolymerization initiator $b_3$) and 1.2% by weight of 2,6-di-tert-butyl-p-cresol, 0.002% by weight of the dye solvent Black 3 and 13% by weight of a conventional and known liquid paraffin were used as assistants, the last-mentioned one being a plasticizer. The percentages by weight are based on the total amount of the components $b_1$) to $b_4$) present in the photopolymerizable relief-forming recording layer (B).

In the Examples and Comparative Experiments, a conventional and known standard negative and a conventional and known flat-plate exposure unit containing resin tubes were used for the imagewise exposure to actinic light (process step (1)).

The development of the imagewise exposed relief-forming recording layers (B) (process step (2)) was carried out in a conventional and known cylindrical brush washer. A mixture of 80% by volume of a highboiling hydrogenated mineral oil fraction (Exxsol. D60 from ESSO) and 20% by volume of n-pentanol was used here as the developer.

An aftertreatment lamp unit from Anderson and Vreeland having the dimensions 300×400 mm and containing Philips TUV 40 W tubes was used for the postexposure (aftertreatment) using light having a wavelength λ of <300 nm (process step (3)).

The tack of the printing surface of the photopolymerized relief layers of the flexographic relief printing plates was determined with the aid of the Erichsen pendulum method. For this purpose, solid areas were cut out of the photopolymerized relief layers and the pendulum tack values (=PTV) were determined for these samples. In a known procedure, a cylinder connected to a pendulum is placed on the relevant surface and, after a certain deflection of the pendulum, the number of oscillations until the pendulum is stationary is measured. The tackier the relevant surface, the greater is the damping of the oscillation of the pendulum and the lower are the pendulum tack values obtained.

EXAMPLES 1 TO 20 AND COMPARATIVE EXPERIMENTS V1 TO V4

The production of flexographic relief printing plates by the novel (Examples 1 to 20) and conventional (Comparative Experiments V1 to V4) procedures:

The photosensitive recording elements used for carrying out Examples 1 to 20 and Comparative Experiments V1 to V4 each had a total thickness of 4700 μm and each consisted of a 4560 μm thick photopolymerizable relief-forming recording layer (B) and a 125 μm thick polyethylene terephthalate film coated with a polyurethane adhesion-promoting coating, as dimensionally stable substrate (A). In all cases, the preexposure time was chosen so that a relief depth of 3 mm resulted. In the imagewise exposure, the exposure time was chosen at the time when the i dot was well supported with a diameter of 750 μm, i.e. the side walls must on no account be undercut but on the contrary be flat.

The Table shows the composition of the polymeric binder $b_1$) and of the further photosensitive compound $b_4$), as well as the process conditions which were used in the further processing of the photosensitive recording elements. The pendulum tack values obtained with the aid of the pendulum method are shown in the last column.

TABLE

Dependence of the pendulum tack values on the photosensitive compound $b_4$)

| Example | Polymeric binder [% by wt.] | Formula (n) | $R^1$ | $R^2$ | $R^3$ | $R^4$ | $R^5$ | $R^6$ | [% by wt.] | PRT [sec] | ET [min] | POT [min] | PTB |
|---|---|---|---|---|---|---|---|---|---|---|---|---|---|
| 1 | 78.898 | I | methyl | H | H | methoxy | H | H | 0.7 | 20 | 9 | 20 | 83 |
| 2 | 78.898 | I | methyl | H | H | methoxy | H | H | 0.7 | 20 | 9 | 30 | 118 |
| 3 | 78.898 | I | methyl | H | H | methoxy | H | H | 0.7 | 20 | 9 | 20 | 73 |
| 4 | 78.898 | I | methyl | H | H | methoxy | H | H | 0.7 | 20 | 9 | 30 | 109 |
| 5 | 78.898 | I | methyl | H | H | H | H | H | 0.7 | 20 | 9 | 20 | 70 |
| 6 | 78.898 | I | methyl | H | H | H | H | H | 0.7 | 20 | 9 | 30 | 98 |
| 7 | 79.098 | 1 | benzyl | H | H | H | H | H | 0.5 | 20 | 9 | 20 | 75 |
| 8 | 79.098 | I | benzyl | H | H | H | H | H | 0.5 | 20 | 9 | 30 | 97 |

TABLE-continued

| | | | Dependence of the pendulum tack values on the photosensitive compound $b_4$) | | | | | | | | | | |
|---|---|---|---|---|---|---|---|---|---|---|---|---|---|
| | Polymeric | | Photosensitive compound $b_4$) | | | | | | | | | | |
| Example | binder [% by wt.] | Formula (n) | $R^1$ | $R^2$ | $R^3$ | $R^4$ | $R^5$ | $R^6$ | [% by wt.] | PRT [sec] | ET [min] | POT [min] | PTB |
| 9  | 78.598 | I     | benzyl  | H | H | H      | H | H | 1   | 25 | 12 | 20 | 70  |
| 10 | 78.598 | I     | benzyl  | H | H | H      | H | H | 1   | 25 | 12 | 30 | 100 |
| 11 | 78.098 | I     | undecyl | H | H | H      | H | H | 1.5 | 15 | 9  | 20 | 78  |
| 12 | 78.098 | I     | undecyl | H | H | H      | H | H | 1.5 | 15 | 9  | 30 | 125 |
| 13 | 78.598 | I     | undecyl | H | H | methyl | H | H | 1   | 10 | 9  | 20 | 120 |
| 14 | 78.598 | I     | undecyl | H | H | methyl | H | H | 1   | 10 | 9  | 30 | 131 |
| 15 | 78.098 | I     | undecyl | H | H | methyl | H | H | 1.5 | 15 | 9  | 20 | 125 |
| 16 | 78.098 | I     | undecyl | H | H | methyl | H | H | 1.5 | 15 | 9  | 30 | 135 |
| 17 | 78.898 | II(3) | —       | H | H | H      | H | — | 0.7 | 20 | 9  | 20 | 85  |
| 18 | 78.898 | II(3) | —       | H | H | H      | H | — | 0.7 | 20 | 9  | 30 | 120 |
| 19 | 78.898 | II(2) | —       | H | H | H      | H | — | 0.7 | 20 | 9  | 20 | 80  |
| 20 | 78.898 | II(2) | —       | H | H | H      | H | — | 0.7 | 20 | 9  | 30 | 113 |
| V1 | 79.598 |       | —       | — | — | —      | — | — | —   | 20 | 9  | 30 | 55  |
| V2 | 79.598 |       | —       | — | — | —      | — | — | —   | 20 | 9  | 30 | 55  |
| V3 | 79.098 |       | phenyl  | H | H | H      | H | H | 0.5 | 40 | 30 | 20 | 65  |
| V4 | 79.098 |       | phenyl  | H | H | H      | H | H | 0.5 | 40 | 30 | 30 | 90  |

Abbreviations:
PRT Preexposure time
ET Exposure time
POT Postexposure time
PTV Pendulum tack value

We claim:
1. A photosensitive recording element comprising
(A) a dimensionally stable substrate,
(B) a photopolymerizable relief-forming recording layer and, optionally, an adhesion-promoting layer arranged between (A) and (B), a release layer (C) applied to that side of the recording layer (B) which faces away from the substrate (A), and, optionally, a cover sheet (D) applied thereon, the photopolymerizable relief-forming recording layer (B) containing
$b_1$) at least one polymeric binder,
$b_2$) at least one photopolymerizable olefinically unsaturated monomer which is compatible with $b_1$),
$b_3$) at least one photopolymerization initiator and
$b_4$) at least one further photosensitive organic compound wherein one or more aryl alkyl ketones of the formula (I) and (II) serving to provide a tack-free surface

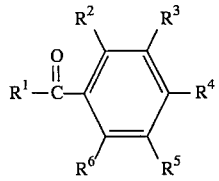 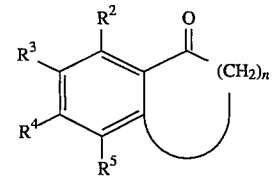

where $R^1$ may be alkyl or alkanediyl, each of 1 to 24 carbon atoms, cycloalkyl or cycloalkanediyl, each of 3 to 12 carbon atoms, n may be 2, 3, 4, 5 or 6 and $R^2$, $R^3$, $R^5$ and $R^6$ are each H, and $R^4$ is H or alkoxy of 1 to 24 carbon atoms are used as the photosensitive organic compound $b_4$).

2. A photosensitive recording element as defined in claim 1, wherein the aryl alkyl ketone ($b_4$) used is one in which the alkyl radical is of i to 18 carbon atoms.

* * * * *

UNITED STATES PATENT AND TRADEMARK OFFICE
CERTIFICATE OF CORRECTION

PATENT NO.: 5,468,596

DATED: November 21, 1995

INVENTOR(S): LOERZER et al.

It is certified that error appears in the above-identified patent and that said Letters Patent is hereby corrected as shown below:

Column 10, claim 2, last line, 45, "i to18" should read --1 to 18--.

Signed and Sealed this

Thirteenth Day of February, 1996

Attest:

BRUCE LEHMAN

Attesting Officer

Commissioner of Patents and Trademarks